United States Patent
Flagello et al.

(10) Patent No.: US 12,346,029 B2
(45) Date of Patent: Jul. 1, 2025

(54) CURVED RETICLE BY MECHANICAL AND PHASE BENDING ALONG ORTHOGONAL AXES

(71) Applicant: Nikon Corporation, Tokyo (JP)

(72) Inventors: Donis G. Flagello, Half Moon Bay, CA (US); Daniel Gene Smith, Tuscon, AZ (US); Michael Birk Binnard, Belmont, CA (US); Stephen Paul Renwick, Moss Beach, CA (US)

(73) Assignee: Nikon Corporation, Tokyo (JP)

( * ) Notice: Subject to any disclaimer, the term of this patent is extended or adjusted under 35 U.S.C. 154(b) by 341 days.

(21) Appl. No.: 17/662,070

(22) Filed: May 4, 2022

(65) Prior Publication Data

US 2022/0357666 A1 Nov. 10, 2022

Related U.S. Application Data

(60) Provisional application No. 63/184,738, filed on May 5, 2021.

(51) Int. Cl.
| | | |
|---|---|---|
| *G03F 7/00* | (2006.01) | |
| *G02B 5/08* | (2006.01) | |
| *G02B 5/18* | (2006.01) | |
| *G03F 1/60* | (2012.01) | |

(52) U.S. Cl.
CPC ....... *G03F 7/70191* (2013.01); *G02B 5/1828* (2013.01); *G02B 5/1838* (2013.01); *G03F 1/60* (2013.01); *G02B 5/0891* (2013.01)

(58) Field of Classification Search
CPC .. G02B 5/0891; G02B 5/1828; G02B 5/1838; G03F 1/60; G03F 7/70191; G03F 1/00; G03F 1/24; G03F 7/70033; G03F 7/70075; G03F 7/70158; G03F 7/70175
See application file for complete search history.

(56) References Cited

U.S. PATENT DOCUMENTS

| | | | |
|---|---|---|---|
| 7,585,596 B1 * | 9/2009 | Johnson | G03F 7/0005 430/311 |
| 8,252,491 B2 | 8/2012 | Van Haren et al. | |
| 8,934,085 B2 | 1/2015 | Dinger et al. | |

(Continued)

FOREIGN PATENT DOCUMENTS

| | | |
|---|---|---|
| JP | 2008-95229 | 4/2008 |
| TW | 201802614 | 1/2018 |

(Continued)

*Primary Examiner* — Deoram Persaud
(74) *Attorney, Agent, or Firm* — Klarquist Sparkman, LLP

(57) ABSTRACT

Collection reflectors with multiple reflector elements defined on a curved surface are used to collect EUV optical radiation from an EUV emitting area. Each of the reflector elements can image the emitting area at or near a corresponding reflective element of a second multi-element reflector that overlaps radiation from each of the multiple reflector element of the collection reflector to illuminate a grating reticle. Systems with such a collection reflector can use fewer optical elements. In addition, grating reticles are defined on a curve substrate an include a plurality of grating phase steps so that the grating reticle provides phase curvature along two axes but with physical curvature along a single axis. Methods of producing varying duty cycle 1D patterns are also disclosed.

34 Claims, 11 Drawing Sheets

(56) References Cited

U.S. PATENT DOCUMENTS

| | | | |
|---|---|---|---|
| 9,632,429 B2 | 4/2017 | Ward et al. | |
| 10,295,911 B2 | 5/2019 | Binnard et al. | |
| 10,747,117 B2 | 8/2020 | Binnard et al. | |
| 10,890,849 B2 | 1/2021 | Flagello et al. | |
| 11,099,483 B2 | 8/2021 | Flagello et al. | |
| 11,300,884 B2 | 4/2022 | Smith et al. | |
| 11,934,105 B2* | 3/2024 | Smith | G02B 17/061 |
| 2006/0132747 A1 | 6/2006 | Singer et al. | |
| 2010/0068654 A1* | 3/2010 | Fonseca | G03F 7/70283 |
| | | | 257/E21.023 |
| 2011/0310374 A1* | 12/2011 | Solak | G03F 7/201 |
| | | | 355/77 |
| 2016/0062246 A1* | 3/2016 | Clube | G03F 7/70408 |
| | | | 355/67 |
| 2018/0364586 A1* | 12/2018 | Clube | G03F 7/70408 |
| 2020/0073251 A1* | 3/2020 | Smith | G03F 7/702 |
| 2020/0340859 A1* | 10/2020 | Meng | G01J 3/1838 |
| 2021/0103222 A1* | 4/2021 | Clube | G03F 7/70408 |
| 2022/0155691 A1* | 5/2022 | Clube | G02B 5/1857 |
| 2023/0160820 A1* | 5/2023 | Lane | G03F 7/70466 |
| | | | 356/625 |
| 2023/0305407 A1* | 9/2023 | Liu | G03F 1/44 |

FOREIGN PATENT DOCUMENTS

| | | |
|---|---|---|
| TW | 202028891 | 8/2020 |
| TW | 202115506 | 4/2021 |
| WO | WO2017/199096 | 11/2017 |

\* cited by examiner

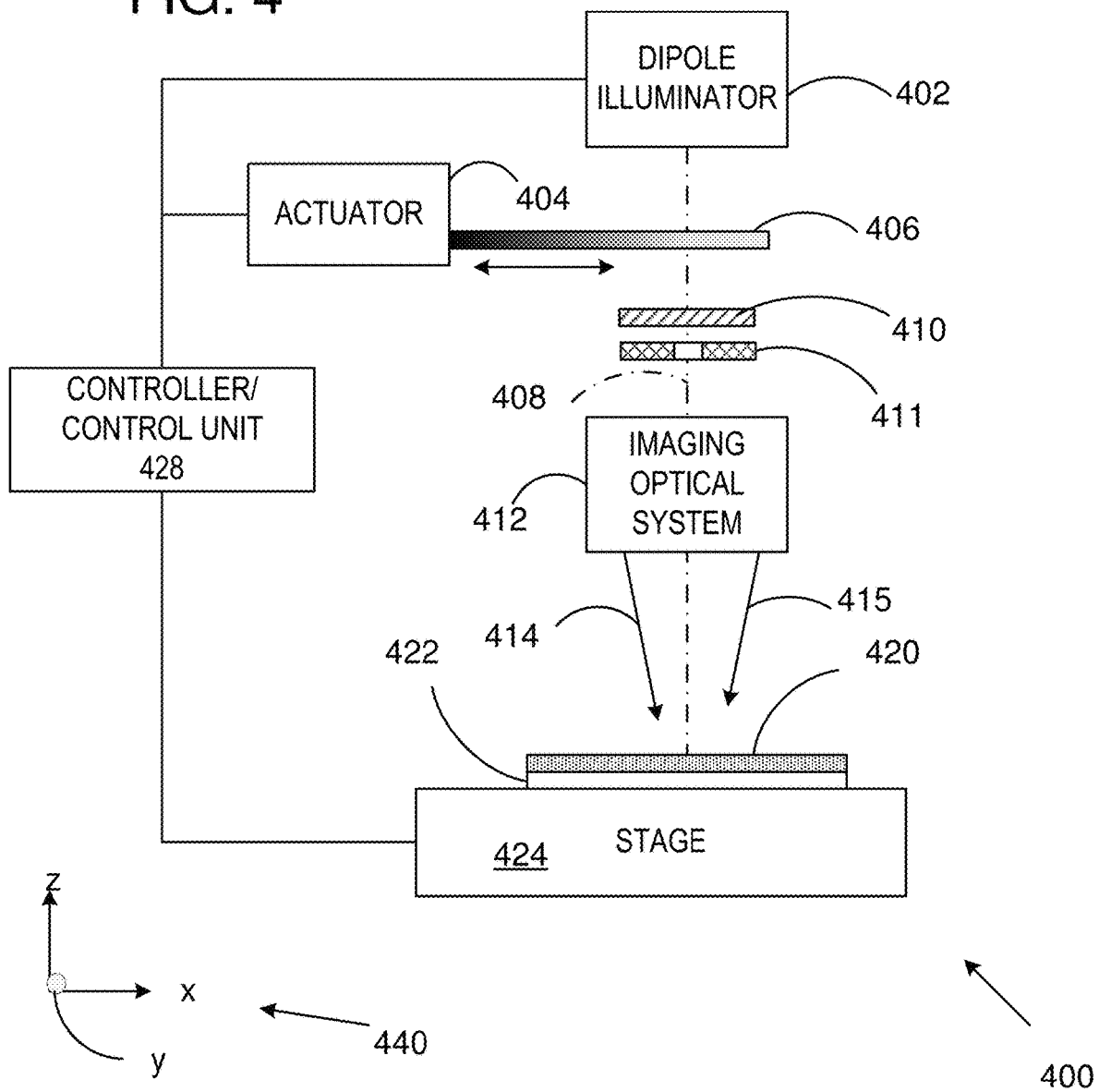

FIG. 6C
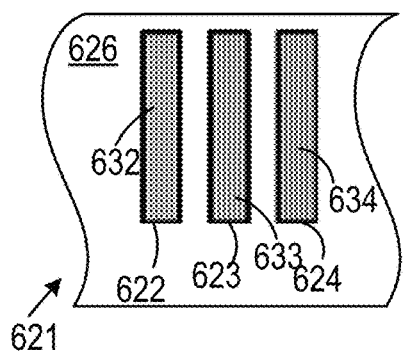
FIG. 6D
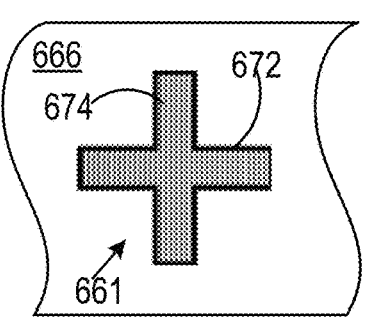
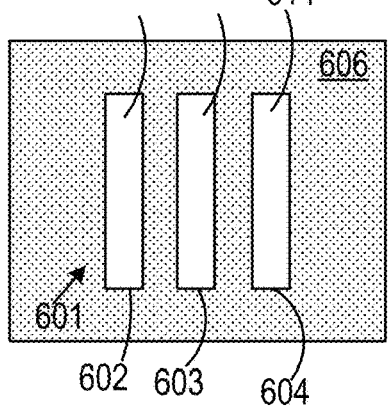
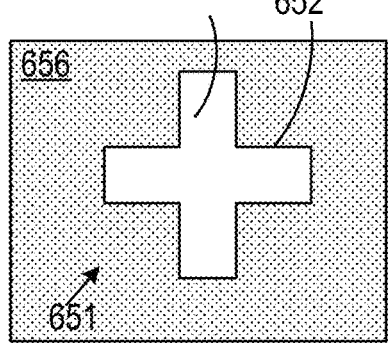
FIG. 6A
FIG. 6B
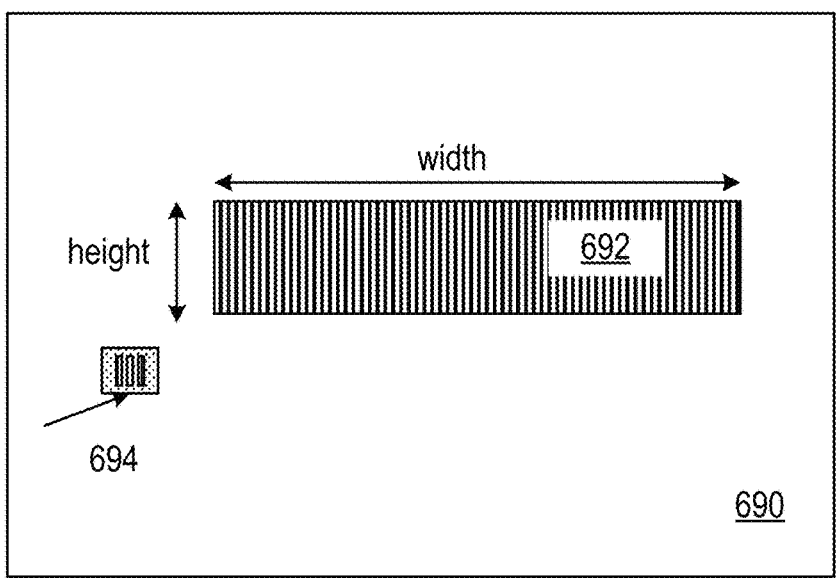
FIG. 6E

CURVED RETICLE BY MECHANICAL AND PHASE BENDING ALONG ORTHOGONAL AXES

CROSS REFERENCE TO RELATED APPLICATIONS

This application claims the benefit of U.S. Provisional Patent Application 63/184,738, filed May 5, 2021, which is incorporated herein by reference.

FIELD

The disclosure pertains to pattern-transfer apparatus.

RELATED TECHNOLOGY

The disclosure pertains to pattern-transfer apparatus such as disclosed in U.S. Pat. Nos. 10,890,849, 10,295,911, and 10,747,117, all of which are incorporated herein by reference in their entireties.

BACKGROUND

One-dimensional pattern transfer systems can be used to define dense line/space patterns on substrates. Because these systems typically operate at extreme ultraviolet wavelengths (EUV), optical losses can be high, and it can be difficult to provide high efficiencies and high throughput. Conventional systems use multiple reflective optical elements for illumination and projection, and do not permit correction of field curvature or other image defects. The present disclosure addresses some limitations of these conventional systems.

SUMMARY

Reticles comprise a substrate and a diffraction grating defined on the substrate, the diffraction grating having a variable phase along at least one axis. In examples, the diffraction grating is defined as a plurality of zones having respective phase shifts with respect to adjacent zones. The zones of the plurality of zones can be separated at respective boundaries that extend perpendicular to the at least one axis. In some cases, grating lines in adjacent zones have a phase difference of 180 degrees and/or can be parallel to the at least one axis. The substrate can be curved about an axis parallel to the at least one axis and the variable phase of the diffraction grating is selected to provide a first focal length and a second focal length, respectively.

Illumination systems comprise a collection reflector situated to receive EUV radiation from a radiation source, the collection reflector having a reflective surface defining a plurality of reflective segments. An illumination reflector having a plurality of reflective segments is situated to receive the EUV radiation from the collection reflector, wherein each element of the illumination reflector is situated to produce an image of a corresponding reflective segment of the collection reflector at an illumination region. Each reflective segment of the collection reflector can be situated to produce a respective image of a source region defined by the radiation source at the corresponding reflective segment of the illumination reflector. The collection reflector can be situated with respect to a source region defined by the radiation source so that each of the plurality of reflective segments produces a respective sub-beam that is directed toward an axis of the collection reflector. In examples, the collection reflector defines an aperture situated to transmit the EUV radiation from the radiation source to a radiation source region. The reflective surface on which the plurality of reflective segments is defined can be a concave surface facing the illumination reflector. A curvature of the concave surface can be selected so that the sub-beams propagate towards the illumination reflector by crossing an axis of the concave surface and an aperture can be defined in the concave surface and on the axis of the concave surface. In examples, the collection reflector and the illumination reflector are the only two reflectors of the illumination system. The illumination reflector can have a planar surface on which each of the reflective segments of the illumination reflector is defined and the reflective surface of the collection reflector can define a diffraction grating. In examples, the diffraction grating has a pitch selected so that radiation at selected wavelengths longer than an EUV wavelength is diffracted away from the illumination region.

EUV ruling engines operable to print lines on a workpiece comprise an illumination system such as disclosed herein and a projection optical system situated to produce a pattern on workpiece based on diffraction orders associated with a grating reticle situated in the illumination region. In examples, the grating reticle includes at least two grating zones having a relative grating phase shift. The at least two grating zones can be separated by a boundary that is perpendicular to grating lines in the grating zones and the grating reticle can be curved about an axis parallel to the grating lines.

EUV illumination systems comprise a first reflector array including a plurality of first reflector surfaces arranged on a curved surface, each of the first reflector surfaces situated to form a corresponding image of an EUV source. A second reflector array includes a plurality of second reflector surfaces, wherein the second reflector array is situated so that the images of the EUV source produced by the first reflector surfaces are at or near the second reflector surface and the second reflector array overlaps EUV radiation from the images at an illumination surface. In examples, the second reflector surfaces of the second reflector array are arranged on a surface which can be a flat or curved surface. The images of the EUV source produced by each of the first reflector surfaces can be at or near corresponding second reflector surfaces of the second reflector.

EUV illumination methods comprise collecting EUV radiation from an emission region with a collection reflector having multiple reflector elements defined on a curved surface and directing the collected EUV radiation from each reflector element of the collection reflector to a corresponding reflector element of an illumination reflector.

The EUV radiation directed to the illumination reflector is directed to an illumination region, wherein the reflector elements of the illumination reflector produce overlapping images of the emission region. In some examples, a grating reticle is situated at the illumination region.

Representative methods for printing alignment marks on a workpiece comprise situating at least one alignment aperture at a location optically conjugate to the workpiece location and producing an image of the at least one alignment pattern at the workpiece location by interfering selected diffraction orders produced by a diffraction grating. In some examples, the alignment pattern is formed by an aperture in an opaque material. In some examples, the opaque material is moved to situate the alignment pattern in an imaging field of view for printing the alignment marks, and the opaque material is moved out of the imaging field of view for other printing operations.

Methods for printing alignment marks comprise situating at least one alignment pattern defined by a diffraction grating at a reticle location and producing an image of the at least one alignment pattern at a workpiece location by interfering selected diffraction orders produced by the diffraction grating of the at least one alignment pattern. The alignment pattern can formed on the same substrate as the reticle. In representative examples, the reticle is moved to situate the alignment pattern in an imaging field of view. In some examples, the diffraction grating defining the alignment pattern has a pitch corresponding to a reticle pitch.

Exposure apparatus which exposes\a workpiece with an illumination beam from a grating reticle comprise a workpiece stage operable to translate the workpiece along an axis parallel to grating lines in the grating reticle and a projection optical system situated to receive the illumination beam from the grating reticle and operable to form a line pattern in a sensitized layer on a workpiece based on diffraction orders produced by the grating reticle. A control unit is operable to select a duty cycle of the line pattern in the sensitized layer. The control unit can include a filter situated to selectively attenuate the illumination beam to select the duty cycle and/or a filter situated to selectively attenuate at least one of the diffraction orders to select the duty cycle. The control unit can include an actuator operable to translate the filter and the filter is a linear gradient filter having an optical density or transmittance that changes linearly depending on position along a linear axis. In some examples, the control unit includes an actuator operable to rotate the filter, and the filter is a rotary gradient filter. In further examples, the control unit is coupled to a light source and is operable to establish illumination beam power received by the projection optical system, is coupled to a light source and is operable to establish illumination beam power received by the projection optical system, or is coupled to the workpiece stage and operable to select a duty cycle based on a scan rate of workpiece stage, or a combination thereof.

In representative examples, the exposure apparatus comprise a first optical array including a plurality of first optical segments and a second optical array including a plurality of second optical segments, wherein each of the first optical segments is situated to form a corresponding image of illumination radiation from a light source at or near the second optical array, and the second optical array is situated to overlap illumination radiation from the first optical array at the grating reticle. In typical examples, the light source is an EUV light source, a UV light source, or a visible light source. The first optical array and the second optical array can be lens arrays or the first optical array and the second optical array can be reflector arrays. In some examples, a stop is situated to select the diffraction orders produced by the grating reticle and delivered to the sensitized layer.

Methods for printing a 1D pattern comprise illuminating a grating reticle with an illumination beam and directing a first optical beam and a second optical beam to interfere at a sensitized substrate, wherein the first optical beam and the second optical beam are associated with respective diffraction orders of the illumination beam. An optical dose provided by at least one of the first optical beam and the second optical beam is adjusted to produce a selected duty cycle of line/space pairs produced by the interference at the sensitized substrate. The optical dose can be adjusted by attenuation of at least one of the first optical beam, the second optical beam, and the illumination beam with a filter, adjusting an optical power in the illumination beam, or adjusting a scan rate of the sensitized substrate in the interference of the first optical beam and the second optical beam, or any combination thereof. In some examples, the optical dose is adjusted as the sensitized substrate is scanned by variably inserting an optical filter to attenuate the first optical beam, the second optical beam, or the illumination beam, or any combination thereof. In examples, the 1D pattern is line/space pattern having a varying duty cycle.

The foregoing and other features and advantages will become more apparent from the following detailed description, which proceeds with reference to the accompanying figures.

BRIEF DESCRIPTION OF THE DRAWINGS

FIG. 4 illustrates a representative pattern-transfer system configured to printed diffraction gratings with variable duty cycle.

FIGS. 6A and 6C illustrate representative alignment patterns defined by diffraction gratings.

FIGS. 6B and 6D illustrate images of the alignment patterns of FIGS. 6A and 6C, respectively.

FIG. 6E illustrates a representative grating reticle that includes an alignment pattern.

DETAILED DESCRIPTION

General Considerations

Figure 1A:
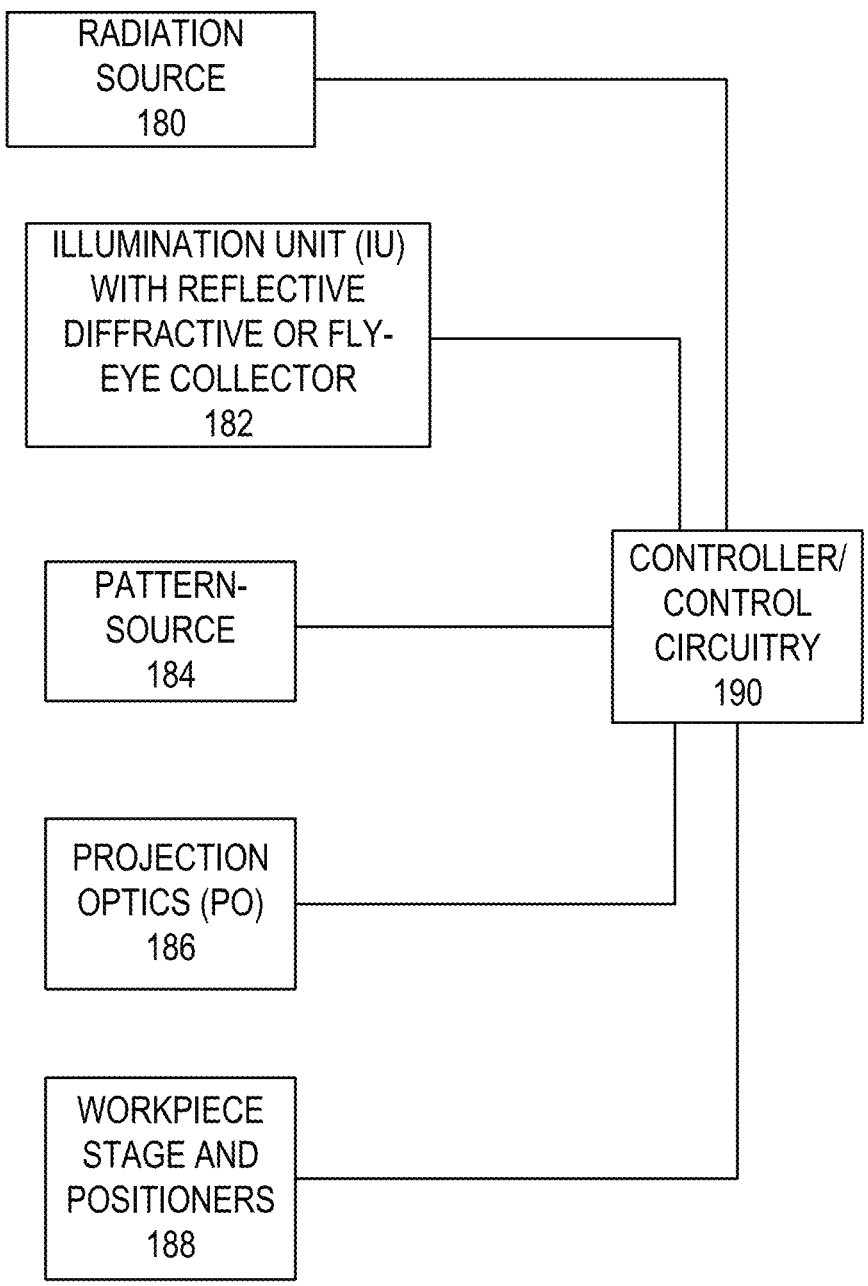
FIG. 1A is a block diagram of a representative one-dimensional (1D) pattern-transfer system.

As used is some disclosed examples, optical radiation used in pattern transfer is deep ultraviolet (DUV) or extreme ultraviolet (EUV) radiation at wavelengths between about 150 nm and 300 nm or 10 nm and 15 nm, respectively, but other wavelengths and other ranges such as ultraviolet and visible light can be used in some applications. In some examples, such optical radiation is referred to as light or illumination for convenience, regardless of wavelength. Systems can be conveniently configured at some wavelength ranges as dioptric, catoptric, or catadioptric, while EUV optical systems are generally reflective (i.e., catoptric). Systems or apparatus that generate optical radiation are referred to as sources or light sources and may or may not include optical elements to shape, collect, collimate, or otherwise direct the generated optical radiation. Such light sources typically can provide concentrated optical radiation at one or more light source regions. In some cases, light leaving an intermediate focus produce with one or more collection optics is referred to as a source. For example, EUV sources can produce an emissive plasma in a selected location that serves as a light source region. In some cases, optical elements (for example, collection reflectors) are referred to as included in an illumination unit that shapes optical radiation and delivers the shaped optical radiation to a pattern-source (often called a mask or a reticle). In the disclosed examples, pattern-sources generally define 1D patterns using diffractive structures such as gratings, and patterns are transferred using interference of diffraction orders produced by the gratings. In some examples, only a workpiece is scanned during pattern-transfer and the pattern-source is fixed, but other arrangements are possible. In some examples, the workpiece is a silicon wafer. The term "printing" is used to refer to formation of a pattern on a substrate, in typical examples, by suitable exposure of a layer or coat such as, e.g., a photoresist. The photoresist may be referred to as a photosensitive layer. The disclosed systems are referred to in some examples as "ruling engines" as they can print parallel lines or lines that are locally parallel on a substrate. The orientation of the lines can be varied, typically by rotating the substrate as in such systems the reticle (i.e., a grating reticle) can be fixed. As used herein, diffraction order generally refers to an optical beam associated with a particular diffraction angle. Grating lines are referred to herein as line/space or black/white patterns for purposes of description but can be defined by amplitude, phase, or combinations of amplitude and phase modulation.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

Example 1. Representative Ruling Engines (PA1824)

Referring to FIG. 1A, a representative ruling engine 175 includes a light source 180 operable to produce exposure radiation such as EUV or DUV radiation. An illumination unit (IU) 182 includes one or more fly-eye reflectors and a collection reflector that can have a fly-eye or diffractive surface. The IU 182 is situated to direct a radiation beam to a pattern-source 184 such as a grating reticle defining a 1D pattern. A projection optical system (PO) 186 is situated to expose a workpiece situated on and positioned by a workpiece stage 188 to define a corresponding pattern in a sensitized layer, such as a photoresist layer on a workpiece. A controller 190 is coupled to one or more of the light source 180, the IU 182, the pattern-source 184, the PO 186, and the workpiece stage 188. The controller 190 can include one or more programmable processors and memories storing processor-executable instructions for pattern transfer with the ruling engine 175. For example, the controller 190 can establish a scan rate of the workpiece stage 188, regulate power produced by the light source 180, adjust the PO system 186, or the IU 182.

Figure 1B:
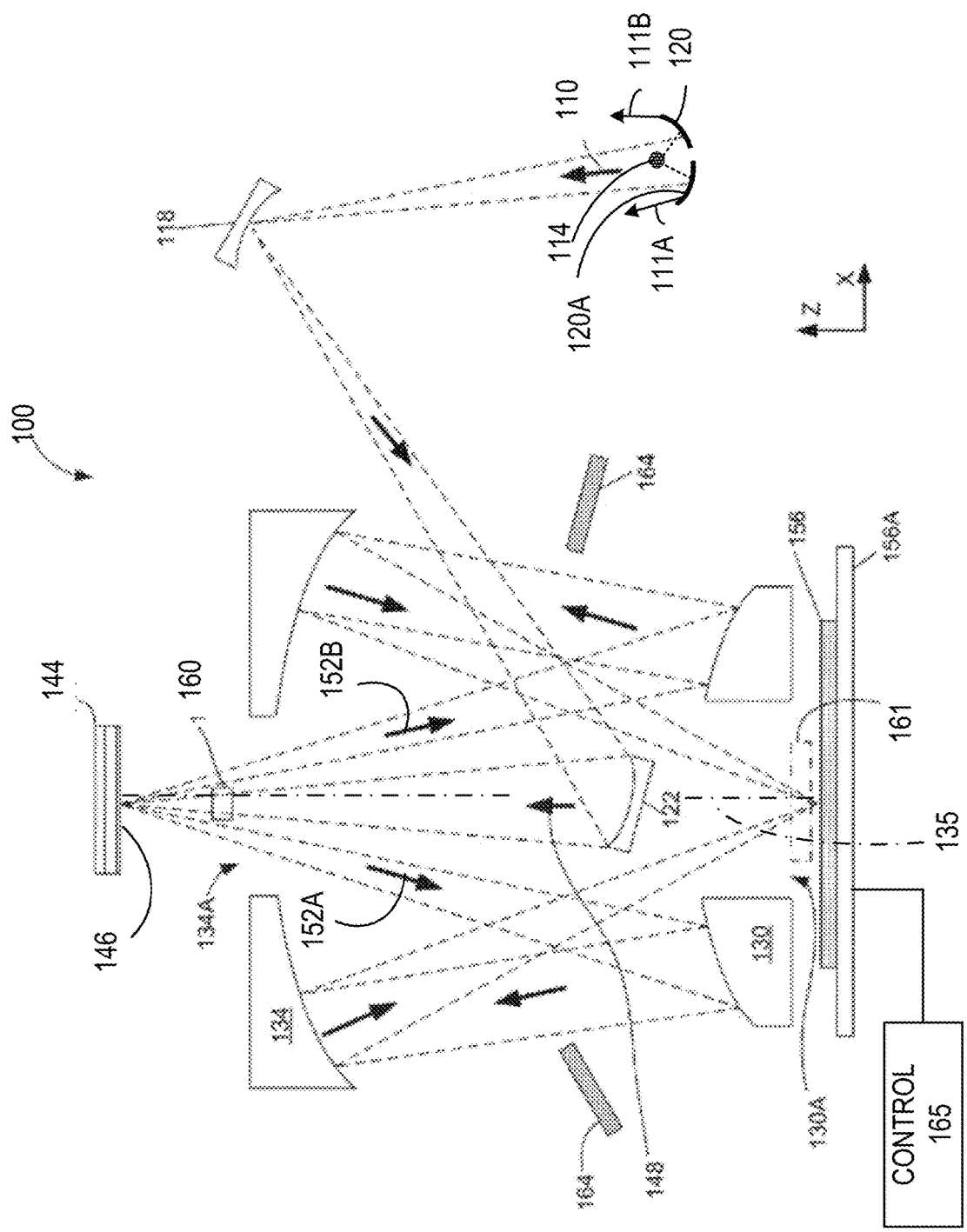
FIG. 1B schematically illustrates a beam path through an optical system for a representative 1D pattern-transfer system.

FIG. 1B illustrates a representative beam path for a 1D EUV system 100. Ray paths are shown for illustration only and with the illustrated ray paths, a light source may appear to be conjugate to a first fly-eye reflector although it is not. The system 100 may include one or more EUV light sources such as a 13.5 nm light source or other source of EUV or DUV radiation. In the example of FIG. 1B, the light source produces an emission region 114 that is typically associated with an induced plasma. The system 100 includes an optical illumination sub-system or unit (IU) including first and second reflectors 118, 122 and a collection reflector 120. The collection reflector 120 can include a diffractive surface selected to diffract radiation that is not useful in pattern exposures such as infrared radiation from the emission region 114. This unwanted radiation can be diffracted along directions such as 111A, 111B so that it does not reach some optical components or a pattern-source 144. One or all of the first and second reflectors 118, 122 and the collection reflector 120 can be multi-element reflectors and serve as fly-eye reflectors as discussed further below. In this example, a projection optical (PO) system includes a two-mirror objective containing a first reflector 130 and a second reflector 134 having respective central apertures 130A, 134A along an axis 135. However, the projection optical system need not be symmetric about the axis 135, and tilted, decentered optical arrangements are convenient.

The first reflector 118 is situated to receive a radiation beam 110 from the emission region 114 that includes radiation collected and shaped into the beam 110 by the collection reflector 120. The first reflector 118 directs the radiation beam 110 to the second reflector 122 which directs a corresponding radiation beam 148 to a pattern-source 144 such as a reticle. The pattern-source 144 can include a spatially-dense 1D pattern and is positioned to receive the radiation beam 148 through the aperture 134A. As shown, the pattern-source 144 is a reflective photomask but in other examples, transmissive photomasks can be used. A surface 146 of the pattern-source 144 can be curved to provide optical power or compensate aberrations and can be referred to as a curved pattern-source, or can be flat and have zero optical power. The optical power can be defined as the reciprocal of the focal length. The 1D pattern may be distorted in a way to compensate for distortion associated with the PO system. When the 1D pattern is configured as an appropriately-dimensioned linear diffraction grating, the pattern-source 144 diffracts the radiation beam 148 to form diffracted beams that include spatially-distinct beams 152A, 152B, respectively, representing diffraction orders, for example, +1 and −1 diffraction orders, that propagate towards a first reflector 130 of the PO system. A zeroth diffraction order or other diffraction order can be blocked with one or suitable stops or apertures. The first and second reflectors 130, 134 direct the diffracted beams through the aperture 130A onto a workpiece 156 or other substrate of interest to expose a sensitized layer such as a photoresist layer with a 1D pattern defined by the pattern-source 144. Typically, the pattern-source 144 is fixed with respect the IU and PO system during exposure but can be configured to be adjustable to maintain focus and alignment.

The ruling engine 100 can also include a fixed or variable aperture 160 (for example, a variable slit of a particular shape) that serves as a field stop. The field stop 160 is generally situated in close proximity to the pattern-source 144. Alternatively, the field stop 161 can be situated in close proximity to the workpiece 156 to interact with diffracted radiation from the pattern-source 144. The distance between the field stop 160 and the pattern-source 144 or between the field stop 161 and the workpiece 144 may be generally less than 3 mm, 1 mm, less than 100 μm, or less than 50 μm. In addition, a pupil stop or aperture 164 can be provided.

The ruling engine 100 can also include stage 156A that is operable to scan the workpiece 156 with respect to the pattern-source 144 and the beams 152A, 152B, as required by a lithographic exposure process. The pattern-source 144 can remain stationary The stage 156A can provide rotation as well to change printed line/space orientation. The workpiece 156 is typically scanned continuously in a first direction, stepped in a direction orthogonal to the scan direction to select a different area to be scanned, and then scanned continuously in a second direction, opposite the first direction. At ends of a workpiece area to be printed, scanning direction can be reversed. This scanning is repeated as needed to print line/space patterns on a selected surface area of the workpiece 156. Other components of the ruling engine 100 such as a vacuum chamber, a metrology system, and a temperature control system are not shown. An x-axis is defined to be perpendicular to a scan axis along which the workpiece 156 is to be scanned and a y-axis is defined to be parallel to a scan axis. In a typical example as shown in FIGS. 1A-1B, the 1D pattern comprises lines parallel to the y-axis.

While interference of diffraction orders produces a line/space pattern at twice the pitch P (times the magnification) of the corresponding structures on the pattern-source 144, the pattern-source 144 is optically conjugate to the workpiece 156. For example, if the magnification is −0.5 (2×), the line/space reduction will be 0.25 or 4×. In typical examples, pattern-source pitch can be 20 nm to 100 nm or larger. Generally, when an imaging optical system has a reduction or enlargement magnification β, the spatial frequency is 2β/P. The ruling engine 100 also include a control unit or control electronic circuitry 165 such as, for example, a programmable processor configured to govern the operation of at least the stage 156A and, in some embodiments, of at least one of a light source(s), the IU, and the PO system. As discussed in detail below, the control unit 165 can adjust a duty cycle of printed lines.

Example 2. Collector with Integrated Multi-Segment (Fly's Eye) Reflector

Figure 2:
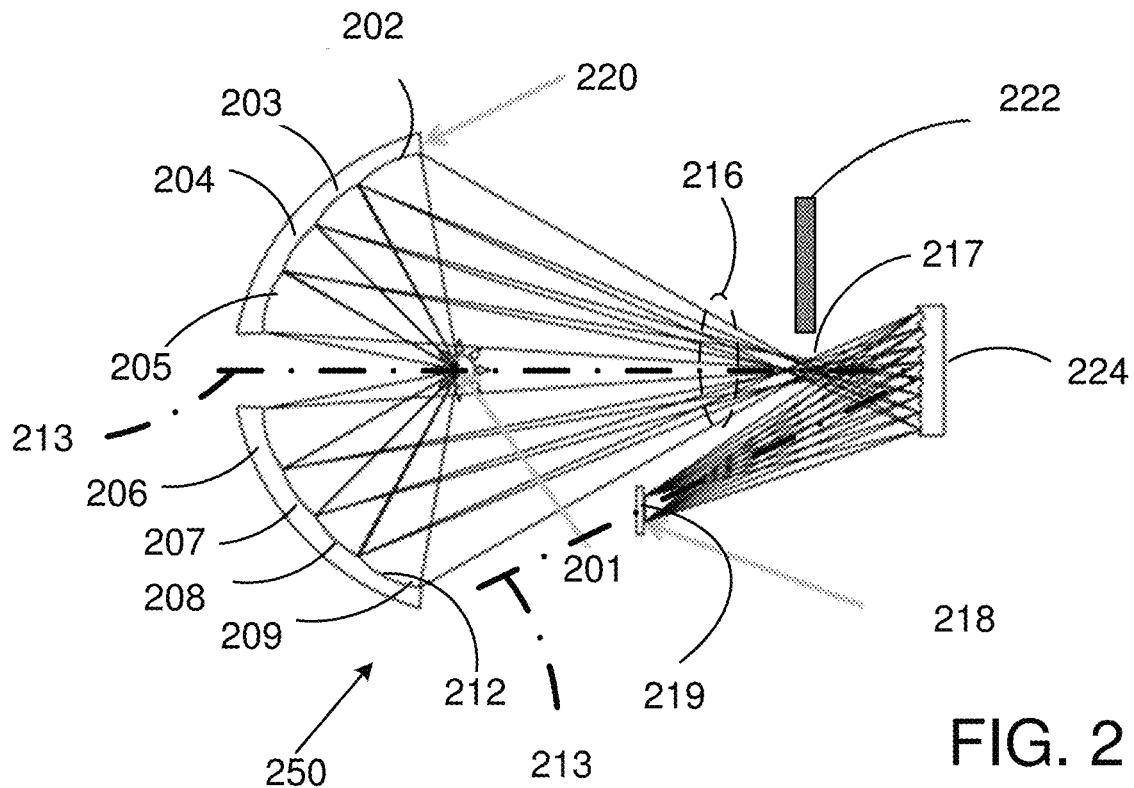
FIG. 2 illustrates a 1D pattern-transfer system having a multi-element (fly-eye) collection reflector.

Referring to FIG. 2, an illumination unit 250 for an exposure apparatus is configured so that radiation from a radiation source such as a plasma 201 that produces EUV/DUV radiation is directed to a collector reflector 220. The collector reflector 220 is generally a fly's-eye reflector and includes multiple reflector elements 202-209. In addition to the reflector elements 202-209, a surface 212 of the collector reflector 220 facing the plasma 201 is configured to define a diffraction grating or other diffractive structure. Such a diffraction grating or diffractive structure can have a grating period or other diffraction characteristic so that portions of the radiation from the plasma 201 that are not useful for exposure of a sensitized substrate do not reach the sensitized substrate. In some examples, the reflective segments 202-209 produce respective subbeams that form a beam 216 of EUV/DUV radiation. As mentioned above, the radiation source 201 may supply UV radiation, visible radiation, or infrared radiation. The beam 216 can be directed through or past an aperture 222 while diffracted radiation at longer wavelengths, such as infrared radiation is blocked at the aperture 222. In examples, diffraction angles of unwanted radiation are selected with the grating period so that the unwanted radiation is reflected out of the optical path traversed by the beam 216. In the example of FIG. 2, the reflective segments 202-209 and the plasma source 201 are arranged so that the subbeams are directed towards an axis 213 to produce a beam spot 217 associated with subbeams crossing the axis 213. A second multi-element reflector 224 is situated to receive the beam 216 and direct EUV/DUV radiation to a reticle 218. Each of reflective segments 202-209 may form an image of a radiation emitting part of the plasma 201 on each element of the second multi-element reflector 224. Beams from each element of the second multi-element reflector 224 irradiate an irradiation area on the reticle 218 in superposed manner. To achieve this, the tilt of each element of the second multi-element reflector 224 is different (each optical axis of each element of the second multi-element reflector 224 intersects at a point on the irradiation area on the reticle). Here, the line segment connecting the center of the second multi-element reflector 224 and one point of the irradiation area and the chief ray of the beam directed from the one point of the irradiation area toward the projection optical system may be symmetrical with respect to the normal of the reticle 218. A projection optical system (not shown in FIG. 2) forms an image of the reticle 218 on a sensitized substrate such as a substrate having a photoresist layer. The reticle 218 is situated on the axis 213 as folded by reflection at the second multi-element reflector 224 so that ballistic debris from the plasma 201 does not tend to reach the reticle 218. In addition, a patterned surface 219 of the reticle 218 preferably faces away from the plasma 201 to avoid receiving debris. The EUV/DUV radiation incident to the reticle 218 is used by a projection optical system (not shown) to produce a suitable pattern on a substrate based on the reticle 218.

The configuration of FIG. 2 directs EUV/DUV radiation to the reticle 218 using only reflections at the collector mirror 220 and the second reflector 224. In contrast to conventional systems, the collector mirror 220 can also include a diffraction grating. Using a small number of reflective surfaces can provide high beam powers for exposure, increasing manufacturing throughput. By contrast, one conventional EUV illuminator includes a collector mirror to collect EUV radiation from a plasma, a collimation mirror, a first fly's eye reflector having sub-aperture shapes that determine the shape of irradiance on a reticle, a second fly's eye reflector, and a condenser mirror that images the first fly's eye to the reticle and the second fly's eye into an entrance pupil of a projection optical system. Such an illuminator uses five reflective surfaces, leading to substantial loses in available EUV/DUV radiation. In another example, the collimator and the first fly's eye reflector are combined and the condenser and the second fly's eye reflector are combined so that three reflections are required. In the example of FIG. 2, the collection reflector serves as a fly's eye reflector as well as a collection reflector, and the illumination unit of FIG. 2 requires only two reflections. Each of the segments 202-209 of the collector reflector 220 as well as curvatures and placements of segments are selected so that respective projected images on the reticle match a desired illumination pattern. The arrangement of FIG. 2 can thus increase available EUV/DUV power because fewer lossy reflections are needed.

With the configuration of FIG. 2, an intermediate area of beam concentration (the spot 217) tends to be larger than in conventional approaches and a larger aperture can be required to transmit the EUV/DUV beam. This larger aperture can also permit debris from the plasma 201 to reach other optical surfaces such as the second reflector 224. In addition, the collection reflector 220 can more complex and more expensive. Because of the placement of the collector reflector 220 with respected to the plasma 201, replacement or restoration due to plasma debris may be necessary from time to time.

As shown in the example of FIG. 2, an EUV illumination system can include a first reflector array having a plurality of first reflector surfaces arranged on a curved surface and a second reflector array having a plurality of second reflector surfaces. Each of the first reflector surfaces is situated to form a corresponding image of an EUV source region. A second reflector array includes a plurality of second reflector surfaces situated so that the images of the EUV source produced by the first reflector surfaces are at or near the second reflector surfaces. The second reflector array overlaps EUV radiation from the images at an illumination surface at which a reticle can be placed.

Example 3. Ruling Engine for AR/VR Applications

According to representative examples, methods for making augmented reality (AR) optics and/or virtual reality(VR) optics that provide high resolution and large image-field areas include configuring an exposure machine to create high-quality linear diffraction gratings of varying duty cycles. Typically, such an exposure machine includes a UV/DUV light source or is coupled to receive such light, a diffraction grating situated on a non-scanning reticle stage to serve as a pattern-source, a scanning filter at, near, or optically conjugate to the reticle to control photoresist exposure, duty cycle, and field limits, a projection optical system, typically with near 1X magnification and low distortion, a scanning stage for a workpiece; and alignment and overlay systems. Such a machine can be cost-effective and permit high provide high throughput lithography.

Figure 3:
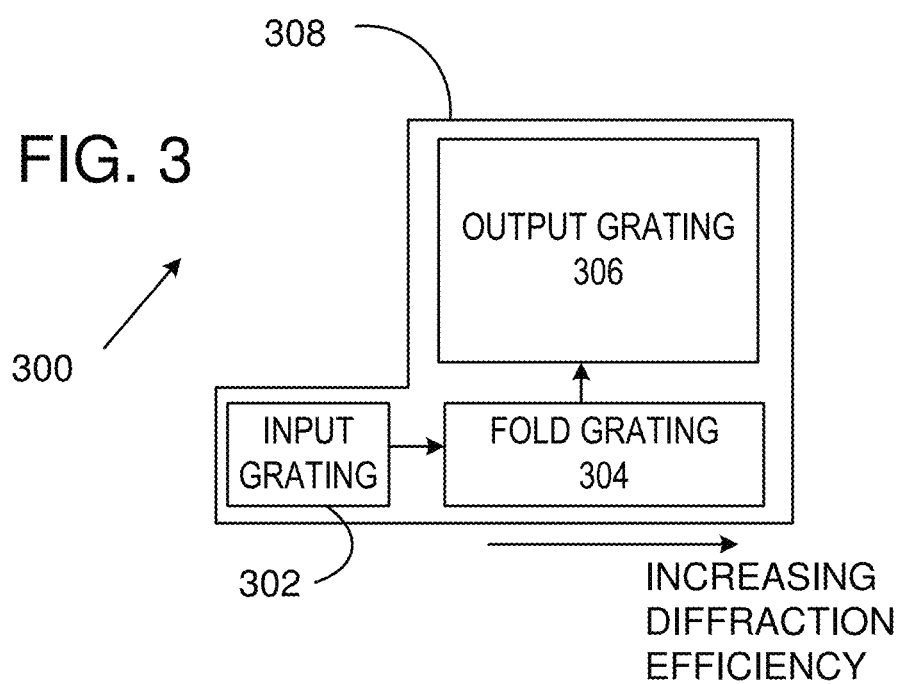
FIG. 3 is a schematic of an augmented reality (AR) apparatus.

AR and VR optics generally require glasses and/or goggles with small form factors (small dimensions) to project a large virtual reality scene; AR optics project the virtual reality scene on top of a normal visual scene. One form factor for AR optics is a pair of normal eyeglasses. AR optics typically expand a projected image into the pupil of the eye using diffractive optics. The form of the diffractive optics in most cases is a linear grating with constant pitch but varying duty cycle. As illustrated in FIG. 3, a typical AR optical system 300 includes an input grating 302 that receives light from a display device such as an LED-based display device and diffracts display light towards a fold grating 304. The fold grating 304 then directs the display light to an output grating 306 which diffracts the display light for viewing. As shown in FIG. 3, the display light is input and output in directions that are out of the plane of the drawing. Propagation of the display light between the gratings 302, 304, 306 can be lossy. The gratings 302, 304, 306 can be secured to a transmissive substrate such as glass, and total internal reflection in the glass substrate used to optically couple two or more of the gratings. For display devices, wavelengths of interest are between about 400 nm and 700 nm.

To maintain uniform image brightness, diffraction efficiency of one or more gratings can be adjusted, typically by varying grating duty cycle along the grating. The grating pitch (or period) is fixed but the spacing between lines and spaces changes. The duty cycle is defined as $W_{line}/P$ wherein $W_{line}$ is grating line width and P is grating period. In addition the pitch of the grating needs to be controlled such that the output display light from the grating 306 has angular changes of less than an angle change of <1.5 arc minutes. This translates to a pitch control of <1 nm and closer to 0.1 nm, depending on design. In the example of FIG. 3, diffraction efficiency in the fold grating preferably increases in the direction shown in FIG. 3 to compensate for losses. This variation can be provided by varying a duty cycle of the grating line pairs. Such gratings can be produce with the apparatus and methods discussed below.

Referring to FIG. 4, a representative ruling system 400 includes an illuminator 402 configured as a dipole illuminator that directs an optical beam along an axis 408 to a filter 406 that is movable with respect to the optical beam. Typically, the filter 406 is a linear gradient filter that is translatable into and out of the optical beam with an actuator 404. The filter 406 has a structure in which the density changes linearly depending on the position in the X direction (the transmittance changes linearly depending on the position in the X direction). Then, the actuator 404 moves the filter 406 in the X direction to change the transmittance of the filter 406 on the illumination optical path. In other examples, a rotary gradient filter having a varying attenuation as a function of angle of rotation and a rotary actuator are used. Other variable attenuation devices can be used as convenient as suitable for the exposure wavelength. For example, spatial light modulators, polarization device, electro-optic or acousto-optic modulators, filter wheels that include multiple filter elements can be used. An optical beam associated with a dipole illuminator generally has two beam portions propagating at different angles at a grating 410, but for convenient illustration, these beam portions are not shown in FIG. 4. The grating 410 (serving as a reticle) is situated to receive a filtered beam from the translatable filter 406 and produce two or more diffracted beams that are directed to an imaging optical system 412. In typical examples, the imaging optical system 412 has unit magnification and directs optical beams 414, 415 associated with a +1 and a −1 diffraction order produced by the diffraction grating 410 and other orders (including a 0th order) are blocked. However, other diffraction orders can be used. The optical beams 414, 415 interfere at a sensitized layer 420 of a substrate 422 and produce a pattern at twice a spatial frequency of the grating 410 (i.e., at a spatial frequency of 2/P, wherein P is a grating pitch). When the imaging optical system 412 has a reduction or enlargement magnification β, the spatial frequency is 2β/P. The substrate 422 is supported by a stage 424 and is translatable along a y-axis (out of or into the plane of FIG. 4) of a coordinate system 440. A controller 428 is operable to cause the actuator 404 to translate the filter 406, to regulate the optical beam from the illuminator 402, and to operate the stage 424 to scan or otherwise adjust a position of the substrate 422 in the optical beams 414, 415. Such adjustments can be used to select and vary a duty cycle of lines printed in the sensitized layer 420.

The example system of FIG. 4 is shown as a transmissive optical system, but some or all optical components can be reflective. For example, the imaging optical system 412 can be a reflective system, the grating 410 can be a reflective grating, and the filter 406 can have a variable reflectance. The particular combination of FIG. 4 is provided for convenient illustration and configurations such as shown in FIG. 1B can also be used. Selection of reflective or transmissive optical components can be a function of component availability at a selected exposure wavelength. The example system of FIG. 4 is also shown with all components situated on-axis This is for convenient illustration and off-axis configurations such as illustrated in FIG. 1B can be used as well. The illuminator 402 can provide optical radiation in a wavelength range of 190 nm to 240 nm or other wavelength range suitable to expose a workpiece.

In an example implementation, periodic lines are formed using dipole illumination with an illumination sigma width of 0.14. The grating 410 can be defined using chrome on a glass or fused silica substrate. The dipole illumination can be matched to grating pitch and the positions of the dipoles in the pupil plane are determined based on the grating pitch and the NA of the optical system. Variations in grating pitch and the resulting printed lines can be provided by changing the reticle and adjusting dipole separation to improve efficiency. Depth of focus of the fringe pattern produced by the interfering diffraction orders can be 1 μm or larger. The field size of the grating reticle image can be small, for example, about 70 mm×10 mm and the grating could run along a length of a substrate. A width in the scanning direction (10 mm in this example) of the field size can be selected to provide suitable exposure times based on available optical power from the dipole illuminator 402. For example, if the dipole illuminator is based on a pulsed laser, a number of illumination pulses can be selected for a particular exposure region. For a given scanning velocity, the number of laser pulses that will illuminate each point on the substrate 422 is proportional to the width of the exposure field in the scanning direction. The relatively small field size on the reticle (compared to the roughly 150 mm square area used in semiconductor manufacturing) can allow for excellent distortion control. In the example of FIG. 4, only the substrate is scanned (moved) and scan time is function of printed line length. The optical system can be configured to provide unit magnification, permitting low aberrations and low distortion. With dipole illumination, a central portion of the pupil is not used and aberration correction can be targeted at pupil portions associated with dipole illumination.

Figure 5A:
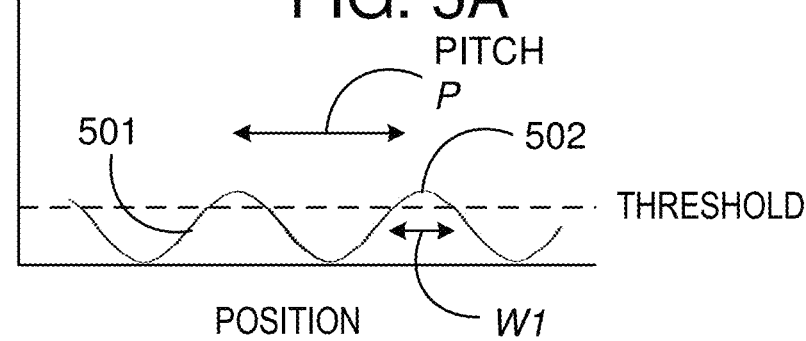
FIGS. 5A-5B illustrate varying grating duty cycle based on illumination dose.
Figure 5B:
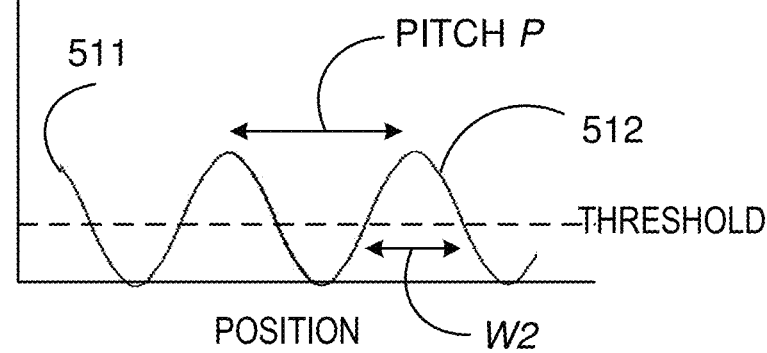

A duty cycle of a printed grating can be varied using the filter 406 to vary optical power in the fringe pattern formed at the sensitized layer 420. The filter 406 need not be placed at any particular location and is conveniently placed optically upstream of the grating 410. In addition, in printing using interfering diffraction orders, such a filter can be situated to attenuate one or both of the diffraction orders. If printed lines are to vary in orientation, the stage 424 can be selected to provide rotations as well as translation. As noted above, duty cycle can be varied in other ways as well by varying an exposure dose (energy/area) based on, for example, optical radiation source power, attenuation of source power, dwell time, scan rate, or source pulse rate and pulse energy FIGS. 5A-5A illustrate printing of lines with differing duty cycles. In FIG. 5A, a relative low amplitude fringe pattern 501 is formed based on a relatively low exposure dose. Only doses above a threshold are printed so that grating duty cycle is low. As shown in FIG. 5A, a portion 502 of the fringe pattern 501 of width W1 has an dose larger than the threshold, and a duty cycle W1/P is relatively low. In FIG. 5B, a relative high amplitude fringe pattern 511 is formed based on a relatively high exposure dose. As shown in FIG. 5B, a portion 512 of the fringe pattern 511 of width W2 has an dose larger than the threshold, and a duty cycle W2/P is relatively high. In FIG. 5A, duty cycle is nearly 50%; further increases in fringe amplitude would increase fringe portions above the threshold such as the portion 512 but would decrease the below threshold portions, resulting in a decrease in duty cycle. Using the translatable filter 406 of FIG. 4 or other approaches, fringe amplitude and duty cycle can be selected. In this way, diffraction efficiencies for fold gratings such as the grating 304 of FIG. 3 can be varied as needed. Duty cycle can also be varied by adjusting optical power in a single one of the interfering beams.

Example 4. Alignment Marks

Printing methods and apparatus discussed above permit printing of dense arrays of lines in a workpiece area that can be defined by a field stop that is optically conjugate to the workpiece. However, the lines are defined by interference of diffraction orders at the workpiece as discussed above and such printing approaches do not generally permit the printing of alignment marks. In one approach, alignment marks can be printed on a workpiece such as workpiece 626 shown in FIG. 6B using an aperture that defines a grating region that can be situated at the location of the field stop used to define the exposure area or at another location that is optically conjugate to the field stop location. Because the disclosed printing approaches are based on interference of diffracted beams, alignment marks without gratings or grating segments would not be printed.

Apertures can have various shapes and representative examples are illustrated in FIGS. 6A and 6C and the corresponding printed alignment patterns are shown in FIGS. 6B and 6D. Referring to FIG. 6A, an alignment pattern 601 includes representative rectangular segments 602-604 that are defined on a substrate 606. The rectangular regions 602-604 are transparent regions within an opaque area. Because grating lines in the patterns are printed by interference, these regions appear gray as printed. The grating regions 612-614 are typically defined by metal layers such as chromium or other metals on a glass, fused silica, or other substrate. In alternative embodiments, the rectangular regions 602-604 may be rectangular holes in a material such as metal or ceramic which blocks exposure light. As shown in FIG. 6B, exposure light that passes through the alignment pattern 601 interferes at the workpiece 626 surface and forms a printed pattern 621 having printed features 622-624 on a workpiece 626 that can consist of lines 632-634 in rectangular segments 622-624 printed in the same manner as features on a pattern-source at twice the pitch. In other words, the lines 632-634 are defined by the reticle grating and dipole illumination in the manner described above, while the shape and size of rectangular segments 622-624 are defined by the alignment pattern 601. While this and other examples can be described with reference to dipole illumination, other types of illumination can be used such as on-axis illumination. In some cases, such as in EUV applications, dipole illumination tends to be inefficient and other types of illumination can be preferred. Because the lines 632-634 have a pitch much smaller than the size of the segments 622-624, an optical system designed to measure the alignment of segments 622-624 will typically have insufficient optical resolution to resolve the lines 632-634. In this manner, the optical alignment system will observe segments 622-624 as three rectangles with an intermediate brightness.

FIG. 6B shows an alternative alignment mark 651 having a cross-shaped grating region in an area defined by a boundary 652 and formed on a substrate 656 which can be the same substrate on which a reticle is formed. As shown in FIG. 6D, the alignment mark 651 is printed as a printed feature 661 on a substrate 666 as a region 674 that includes lines and spaces and bounded by a perimeter 672. FIG. 6E illustrates a representative grating reticle 690 that includes an alignment mark 694 such as described above and a grating region 692 that is used to print line/space pairs on a workpiece. The grating region 692 can have height dimensions such as between 1 mm and 10 mm and width dimensions between 2 mm and 20 mm in some example embodiments. For example, the grating region 692 can be 2 mm by 5 mm.

Figure 6F:
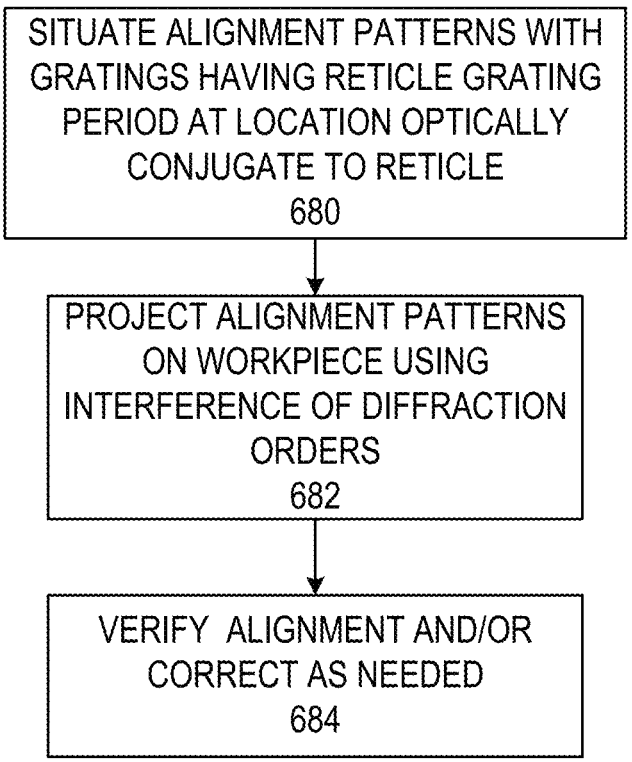
FIG. 6F illustrates an alignment method using alignment patterns such as those of FIGS. 6A and 6C.

Alignment patterns can be defined on the same substrate used to define the print line/space pattern (as shown in FIGS. 6B and 6E) or on a separate substrate (as shown in FIG. 6A). If defined on the same substrate, alignment patterns can be situated in the field of view of an imaging system and the alignment patterns need not be moved for imaging. Otherwise, as with alignment patterns on separate substrates, the alignment patterns are moved into the field of view for imaging. Based on the imaged alignment patterns, some or all components of a pattern-transfer system can be adjusted such as a projection optical system or a workpiece stage. Referring to FIG. 6F, a representative method 679 includes situating alignment patterns at a location optically conjugate to an imaging field 680. The alignment patterns are imaged to a workpiece location at 682 using interference of diffraction orders produced by a reticle grating. At 684, the alignment pattern image is evaluated to verify alignment or to permit adjustment.

Example 5. Curved Reticles with Mechanical and Phase Bending

Reticles based on curved gratings can enable the curvature of the substrate to match field curvature of a projection optical system, whether a flat field or a curve field to increase working distance, for example), while still imaging the exit pupil of an illumination system into an entrance pupil of the projection optical system. Without power in the reticle, there is no way to relay a second fly-eye lens to the entrance pupil of the projection optics. However, by carefully choosing powers of all the elements, some compensation of field curvature can be achieved. Most of the field curvature compensation comes from the negative+positive mirror design.

In an example, a curved grating reticle can be used to image a pupil of an illumination system such as those of FIGS. 1B and 4 into a pupil of a projection optical system. This can reduce the number of reflectors, lenses, or other optical elements and increase optical system light efficiency, especially for systems that operate using EUV or DUV. In some examples, grating reticles are bent along one axis and are phase-modified along an orthogonal axis. In the examples discussed below, grating phase steps are provided on one or two axes and in some cases, combined with grating bending and the associated phase variation about a different axis. Examples are illustrated as binary phase, binary amplitude, or combined binary and phase gratings that are provided in grating zones with 180 degree phase steps. However, continuous phase variation or step-wise variation with steps at less than 180 degrees can be used. In some cases, grating phase variations are stepped along an axis that is perpendicular to a direction along which grating lines of other features extend or along a radial axis so that orientation of grating lines with respect to a grating zone boundary varies. Zone boundaries can image as zero contrast regions, but the area of these regions is small and averaged during scan.

Figure 7A:
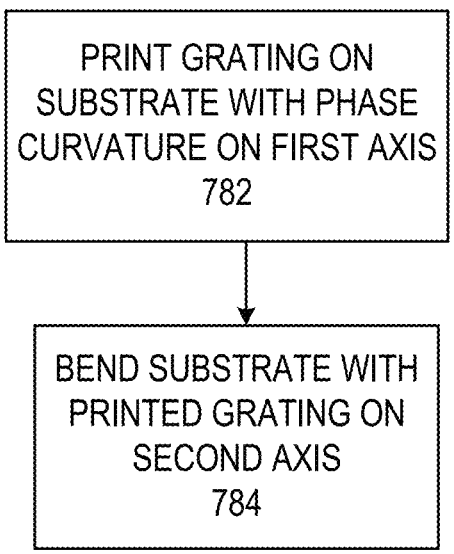
FIG. 7A illustrates a method of forming a curved grating reticle.

As shown in FIG. 7A, a representative method 780 for making a grating reticle with mechanical and phase curvature includes printing a grating on a substrate with phase curvature on a first axis at 782. Typically, the phase curvature in established with zone-plate like phase steps, with the steps arraigned along an axis parallel to the grating lines. The substrate is then bent at 784. In other examples, the substrate is bent and the grating formed on the bent substrate.

Figure 7B:
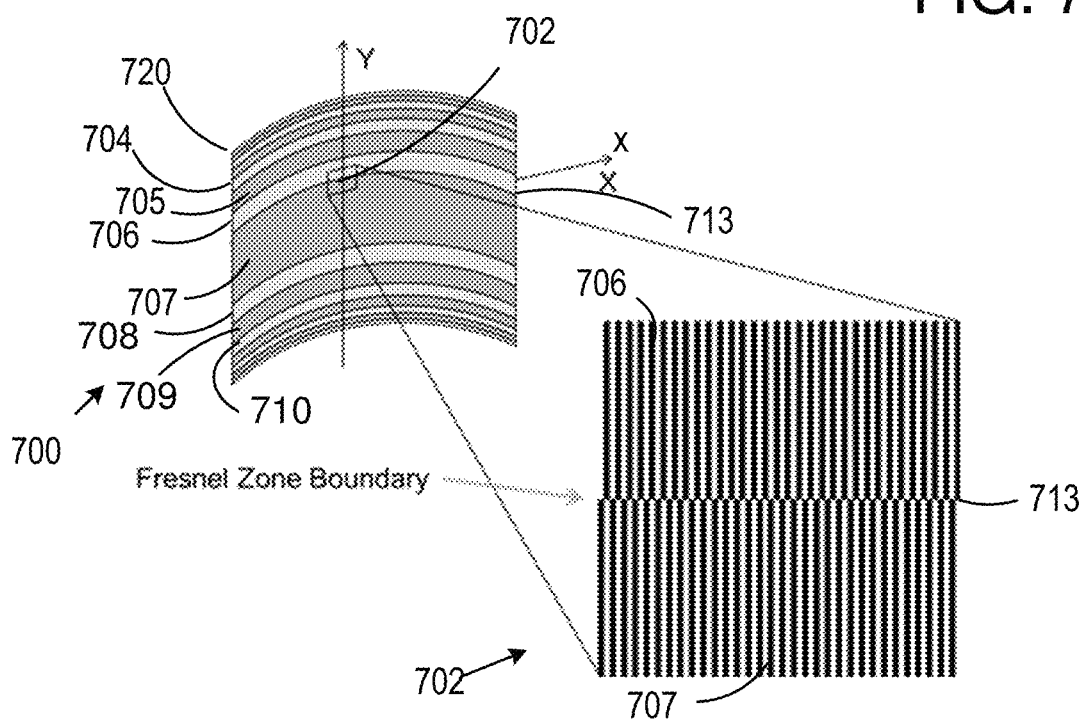
FIG. 7B illustrates a grating reticle having a physical curvature and a phase curvature defined by grating segments.

Referring to FIG. 7B, a representative reticle 700 with mechanical and phase curvature includes a substrate 720 on which a plurality of grating zones 704-710 having phase steps are arranged along a y-axis corresponding to the first axis 782 in FIG. 7A and the substrate 702 is curved about an axis parallel to the y-axis, i.e., is bent in the x-direction corresponding to the second axis 784 in FIG. 7A. In other examples, the axes associated with bending and phase steps need not be orthogonal. A sample portion 702 of the reticle 700 illustrates grating zones 706, 707 separated at a boundary 713 and having a 180 degree phase step. For convenient illustration, periodic features in grating zones are shown as alternating black and white lines (a binary grating). Gratings can be defined by periodic features that provide amplitude, phase, or both amplitude and phase modulation. Features represented as black and while lines need not have the same width, and periodic variations other than black/white (i.e., square wave) can be used such as, for example, sinusoidal or triangle wave variations or other step-wise or continuous variations. Grating lines in the grating zones 706, 707 are parallel to the y-axis but grating features shown as black lines in the grating zone 707 align with grating features shown as white lines in the grating zone 706. This corresponds to a 180 degree grating phase step at the boundary 713. Similar phase steps can be provided at boundaries of other grating zones. Widths of the grating zones 704-710 along the y-axis are selected based on an intended phase curvature.

Figure 7C:
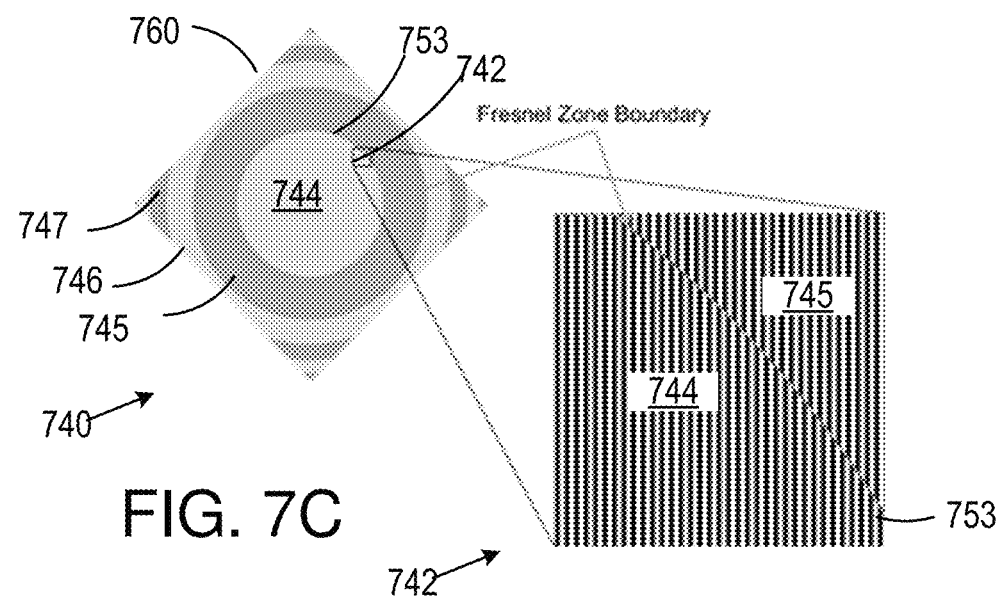
FIG. 7C illustrates a grating reticle having a phase curvature defined by grating segments.

Referring to FIG. 7C, a representative reticle 740 with phase curvature includes a substrate 760 on which grating zones 744-747 having phase steps are arranged concentrically; grating zones 745-747 are concentric about the grating zone 744. A sample portion 742 of the reticle 740 illustrates grating zones 744, 745 separated at a boundary 753 having a 180 degree phase step. For convenient illustration, periodic features in grating zones are shown as alternative black and white lines. Gratings can be defined by periodic features that provide amplitude, phase, or both amplitude and phase modulation. Grating lines in the grating zones 745-746 are parallel to the y-axis but grating features shown as black lines in the grating zone 745 align with grating features shown as white lines in the grating zone 746. This corresponds to a 180 degree grating phase step at the boundary 753. Similar phase steps can be provided at boundaries of other grating zones. Widths of the grating zones 744-747 along a radial direction-axis are selected based on an intended phase curvature.

With grating reticles as shown in FIGS. 7B-7C, a reticle (such as a grating reticle) can image the pupil of the illuminator into the pupil of the projection system while reducing or eliminating residual field curvature at a workpiece. In some example, a phase curvature in the grating pattern is selected to match field curvature.

Figure 7D:
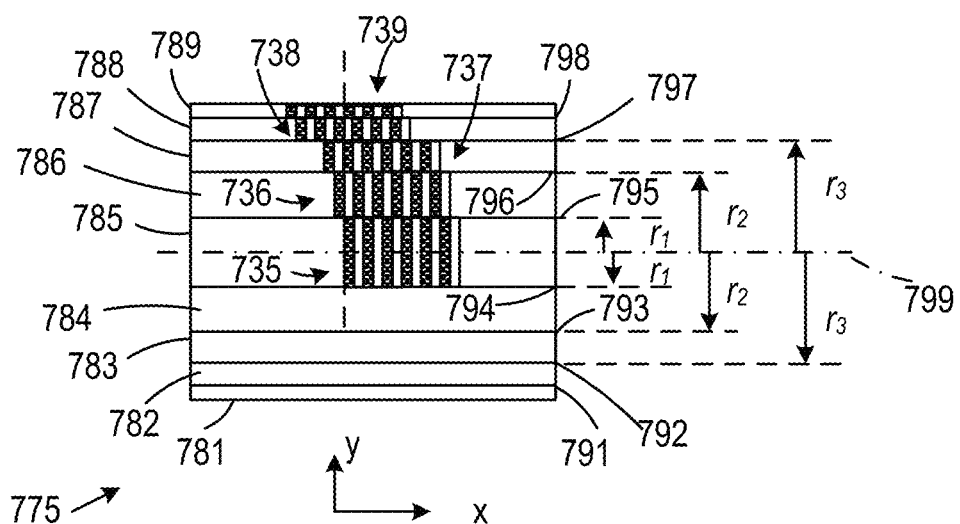
FIG. 7D illustrates grating segment phase differences.

Zone dimensions for the grating reticles illustrated in FIGS. 7B-7C can be selected as follows. To produce a focal length f or a related change in wavefront curvature at a wavelength $\lambda$, phase steps for an $n^{th}$ zone should be positioned at a distance $r_n = \sqrt{n\lambda f + n^2\lambda^2/4}$ from an optical center, wherein n is an integer. For long focal lengths, $r_n = \sqrt{n\lambda f}$. FIG. 7D illustrates a phase-stepped grating reticle 775 that includes zones 781-789 and having associated zone boundaries 791-798. Representative grating sections (dark/white pairs) 735-739 are illustrated in selected zones. Each zone is typically filled with grating line pairs but these are not shown in FIG. 7C. Distances $r_n$ to zone boundaries along a y-axis and measured from an axis 799 for selected zones are illustrated. With 180 degree phase shifts between zones, a grating feature that is white in the zone 785 is aligned with a white grating feature in zones 787, 789 and with dark grating features in zones 786, 788. As shown in FIG. 7D, it appears that the grating sections shift left but this indicates only that white and dark lines interchange at each boundary. For convenient illustration, other grating lines in the zones 775-779 are not shown. Zones for the concentric arrangement of FIG. 7C are selected in the same way, but with the distance $r_n$ representing a zone radius. The reticles 700, 745, 775 may be referred to as diffractive members.

Example 6. Representative Illumination Method for Ruling Engines

Figure 8:
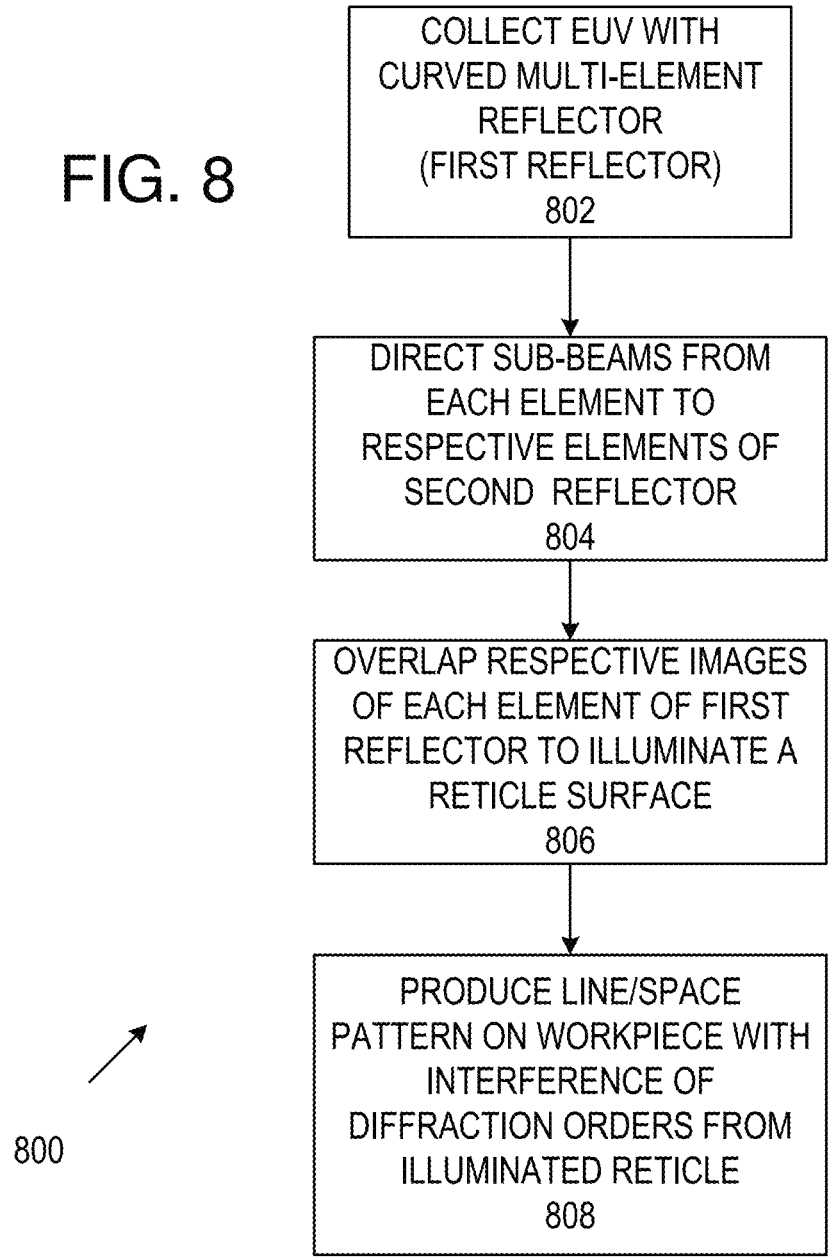
FIG. 8 illustrates a representative method of 1D pattern transfer using a collection reflector with a curved, multi-element surface.

Referring to FIG. 8, a representative method 800 for illuminating a reticle such as a grating reticle includes collecting optical radiation such as EUV radiation with a curved, multi-element reflector at 802. For convenient description, this multi-element reflector can be referred to as a collection reflector. Such a collection reflector is generally shaped and positioned to collect EUV from an emission region over a large solid angle. The reflector elements of the collection reflector produce respective sub-beams that are directed to corresponding elements of a second multi-element reflector at 804. In addition, the subbeams typically produce respective images of the emission region at or near the second reflector. The reflector elements of the second multi-element reflector are situated and configured to overlap respective images of associated reflector elements of the collection reflector at or near a reticle surface or other workpiece or target surface at 806. For convenient description, the second multi-element reflector can referred to as the illumination reflector. At 808, a line/space pattern is produced at a sensitized substrate based on interference of diffraction orders from a grating reticle illuminated by the illumination reflector using a projection optical system. Duty cycle of the line/space pattern can be varied by varying dose such as by changing a workpiece scan rate, varying illumination beam power with a filter, aperture, or other optical device, or by varying optical power at the emission region. In addition, the grating reticle can be flat, curved along one or both axes, or curved about one axis and provided with phase steps to produce an effective curvature about another axis. In typical examples, the workpiece is scanned to extend the line/space pattern across the workpiece.

Example 7. Representative Device Fabrication Method

Figure 9:
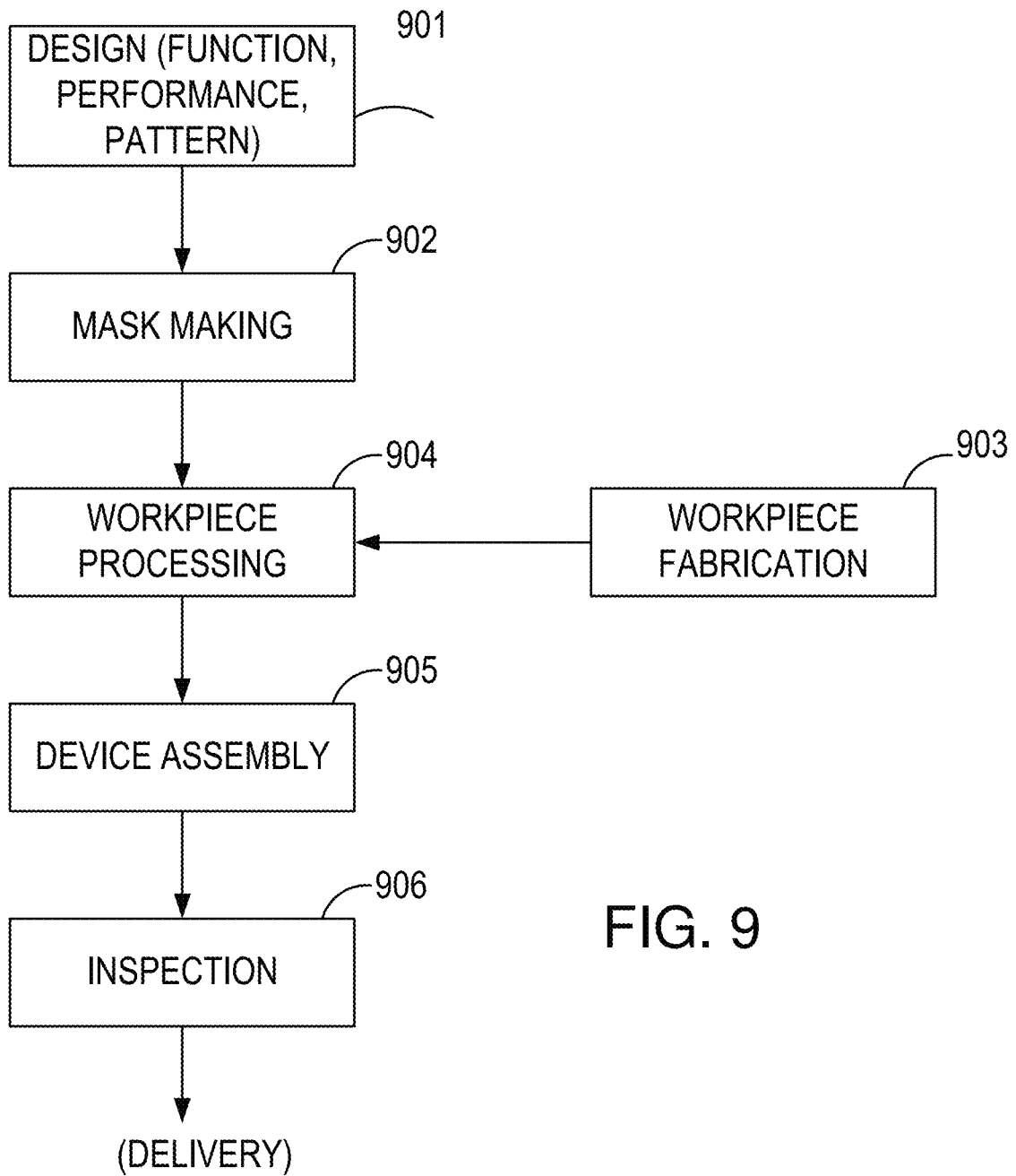
FIG. 9 illustrates a device fabrication method.

Various devices such as semiconductor devices and AR devices can be fabricated by processes including the pattern-transfer systems as described above. Referring to FIG. 9, in step 901 the function and performance characteristics of the device are designed. In step 902, a reticle is designed and fabricated with a suitable diffraction characteristic such as a grating pitch and/or grating duty cycle. The reticle can be curved about one or more axes and provided with an effective curvature based on grating phase changes which can be stepped or continuous. In step 903, a workpiece such as a semiconductor wafer or other substrate is fabricated and coated with a suitable resist. In step 904 ("workpiece processing") the reticle is used to print a line/space pattern on or at the surface of the substrate (typically at the resist layer). In some cases, a curved, segmented reflector is used to collect optical radiation from a source for use in printing. In step 905, additional processing is performed to, for example, produce semiconductor devices, AR devices, or other devices. In step 906 assembled devices are tested and inspected.

Representative Examples

Example 1 is a reticle, including a substrate and a diffraction grating defined on the substrate, the diffraction grating having a variable phase along at least one axis.

Example 2 includes the subject matter of Example 1, and further specifies that the diffraction grating is defined as a plurality of zones having respective phase shifts with respect to adjacent zones.

Example 3 includes the subject matter of any of Examples 1-2, and further specifies that the zones of the plurality of zones are separated at respective boundaries that extend perpendicular to the at least one axis.

Example 4 includes the subject matter of any of Examples 1-3, and further specifies that grating lines in adjacent zones have a phase difference of 180 degrees.

Example 5 includes the subject matter of any of Examples 1-4, and further specifies that grating lines of the diffraction grating are parallel to the at least one axis.

Example 6 includes the subject matter of any of Examples 1-5, and further specifies that the substrate is curved about an axis parallel to the at least one axis.

Example 7 includes the subject matter of any of Examples 1-6, and further specifies that the substrate is curved and the variable phase of the diffraction grating is selected to provide a first focal length and a second focal length, respectively.

Example 8 is an illumination system, including: a collection reflector situated to receive EUV radiation from a radiation source, the collection reflector having a reflective surface defining a plurality of reflective segments; and an illumination reflector having a plurality of reflective segments, the illumination reflector situated to receive the EUV radiation from the collection reflector, wherein each element of the illumination reflector is situated to produce an image of a corresponding reflective segment of the collection reflector at an illumination region.

Example 9 includes the subject matter of Example 8, and further specifies that each reflective segment of the collection reflector is situated to produce a respective image of a source region defined by the radiation source at the corresponding reflective segment of the illumination reflector.

Example 10 includes the subject matter of any of Examples 8-9, and further specifies that the collection reflector is situated with respect to a source region defined by the radiation source so that each of the plurality of reflective segments produces a respective subbeam that is directed toward an axis of the collection reflector.

Example 11 includes the subject matter of any of Examples 8-10, and further specifies that the collection reflector defines an aperture situated to transmit the EUV radiation from the radiation source to a radiation source region.

Example 12 includes the subject matter of any of Examples 8-11, and further specifies that the reflective surface on which the plurality of reflective segments is defined is a concave surface facing the illumination reflector.

Example 13 includes the subject matter of any of Examples 8-12, and further specifies that a curvature of the concave surface is selected so that the subbeams propagate towards the illumination reflector by crossing an axis of the concave surface.

Example 14 includes the subject matter of any of Examples 8-13, and further specifies that an aperture is defined in the concave surface and on the axis of the concave surface.

Example 15 includes the subject matter of any of Examples 8-14 and further specifies that the collection reflector and the illumination reflector are the only two reflectors of the illumination system.

Example 16 includes the subject matter of any of Examples 8-15, and further specifies that the illumination reflector has a planar surface on which each of the reflective segments of the illumination reflector is defined.

Example 17 includes the subject matter of any of Examples 8-16, and further specifies that the reflective surface of the collection reflector defines a diffraction grating.

Example 18 includes the subject matter of any of Examples 8-17, and further specifies that the diffraction grating has a pitch selected so that radiation at selected wavelengths longer than an EUV wavelength is diffracted away from the illumination region.

Example 19 is an EUV ruling engine operable to print lines on a workpiece, including: the illumination system of Example 8; and a projection optical system situated to produce a pattern on workpiece based on diffraction orders associated with a grating reticle situated in the illumination region.

Example 20 includes the subject matter of Example 19, and further includes the grating reticle.

Example 21 includes the subject matter of any of Examples 18-20, and further specifies that the grating reticle includes at least two grating zones having a relative grating phase shift.

Example 22 includes the subject matter of any of Examples 18-21, and further specifies that the at least two grating zones are separated by a boundary that is perpendicular to grating lines in the grating zones and the grating reticle is curved about an axis parallel to the grating lines.

Example 23 is an EUV illumination system, including: a first reflector array including a plurality of first reflector surfaces arranged on a curved surface, each of the first reflector surfaces situated to form a corresponding image of an EUV source; and a second reflector array including a plurality of second reflector surfaces, the second reflector array situated so that the images of the EUV source produced by the first reflector surfaces are at or near the second reflector surface, and further wherein the second reflector array overlaps EUV radiation from the images at an illumination surface.

Example 24 includes the subject matter of Example 23, and further specifies that the second reflector surfaces of the second reflector array are arranged on a surface.

Example 25 includes the subject matter of any of Examples 23-24, and further specifies that the surface is a flat surface.

Example 26 includes the subject matter of any of Examples 23-25, and further specifies that the images of the EUV source produced by each of the first reflector surfaces are at or near corresponding second reflector surfaces of the second reflector.

Example 27 is an EUV illumination method, including: collecting EUV radiation from an emission region with a collection reflector having multiple reflector elements defined on a curved surface; directing the collected EUV radiation from each reflector element of the collection reflector to a corresponding reflector element of an illumination reflector; and directing the EUV radiation directed to the illumination reflector to an illumination region, wherein the reflector elements of the illumination reflector produce overlapping images of the emission region.

Example 28 includes the subject matter of Example 27, and further includes situating a grating reticle at the illumination region.

Example 29 is a method for printing alignment marks on a workpiece, including: situating at least one alignment pattern at a location optically conjugate to a workpiece location; and producing an image of the at least one alignment pattern at the workpiece location by interfering selected diffraction orders produced by a diffraction grating.

Example 30 includes the subject matter of Example 29, and further specifies that the at least one alignment pattern is formed by an aperture in an opaque material.

Example 31 includes the subject matter of any of Examples 29-30, and further includes: moving the opaque material to situate the alignment pattern in an imaging field of view for printing alignment marks; and moving the opaque material out of the imaging field of view for other printing operations.

Example 32 is a method for printing alignment marks, including: situating at least one alignment pattern defined by a diffraction grating at a reticle location; and producing an image of the at least one alignment pattern at a workpiece location by interfering selected diffraction orders produced by the diffraction grating of the at least one alignment pattern.

Example 33 includes the subject matter of Example 32, and further specifies that the alignment pattern is formed on the same substrate as the reticle.

Example 34 includes the subject matter of any of Examples 32-33, and further includes moving the reticle to situate the alignment pattern in an imaging field of view.

Example 35 includes the subject matter of any of Examples 32-34, and further specifies that the diffraction grating defining the alignment pattern has a pitch corresponding to a reticle pitch.

Example 36 is an exposure apparatus which exposes a workpiece with an illumination beam from a grating reticle, the exposure apparatus comprising: a workpiece stage operable to translate the workpiece along an axis parallel to grating lines in the grating reticle; a projection optical system situated to receive the illumination beam from the grating reticle and operable to form a line pattern in a sensitized layer on a workpiece based on diffraction orders produced by the grating reticle; and a control unit operable to select a duty cycle of the line pattern in the sensitized layer.

Example 37 includes the subject matter of Example 36, and further specifies that the control unit includes a filter situated to selectively attenuate the illumination beam to select the duty cycle.

Example 38 includes the subject matter of any of Examples 36-37, and further specifies that the control unit includes a filter situated to selectively attenuate at least one of the diffraction orders to select the duty cycle.

Example 39 includes the subject matter of any of Examples 36-38, and further specifies that the control unit includes an actuator operable to translate the filter, and the filter is a linear gradient filter.

Example 40 includes the subject matter of any of Examples 36-39, and further specifies that the control unit includes an actuator operable to rotate the filter, and the filter is a rotary gradient filter.

Example 41 includes the subject matter of any of Examples 36-40, and further specifies that the control unit is coupled to a light source and is operable to establish illumination beam power received by the projection optical system.

Example 42 includes the subject matter of any of Examples 36-41, and further specifies that the control unit is coupled to a light source and is operable to establish illumination beam power received by the projection optical system.

Example 43 includes the subject matter of any of Examples 36-42, and further specifies that the control unit is coupled to the workpiece stage and operable to select a duty cycle based on a scan rate of workpiece stage.

Example 44 includes the subject matter of any of Examples 36-43, and further includes a first optical array including a plurality of first optical segments and a second optical array including a plurality of second optical segments, wherein each of the first optical segments is situated to form a corresponding image of illumination radiation from a light source at or near the second optical array, and the second optical array is situated to overlap illumination radiation from the first optical array at the grating reticle.

Example 45 includes the subject matter of any of Examples 36-44, and further specifies that the light source is an EUV light source, a UV light source, or a visible light source.

Example 46 includes the subject matter of any of Examples 36-45, and further specifies that the first optical array and the second optical array are lens arrays or the first optical array and the second optical array are reflector arrays.

Example 47 includes the subject matter of any of Examples 36-46, and further includes a stop situated to select the diffraction orders produced by the grating reticle and delivered to the sensitized layer.

Example 48 is a method for printing a 1D pattern, including: illuminating a grating reticle with an illumination beam; directing a first optical beam and a second optical beam to interfere at a sensitized substrate, wherein the first optical beam and the second optical beam are associated with respective diffraction orders of the illumination beam; and adjusting an optical dose provided by at least one of the first optical beam and the second optical beam to produce a selected duty cycle of line/space pairs produced by the interference at the sensitized substrate.

Example 49 includes the subject matter of Example 48, and further specifies that the optical dose is adjusted by attenuation of at least one of the first optical beam, the second optical beam, and the illumination beam with a filter, adjusting an optical power in the illumination beam, or adjusting a scan rate of the sensitized substrate in the interference of the first optical beam and the second optical beam, or any combination thereof.

Example 50 includes the subject matter of any of Examples 48-50 and further specifies that the optical dose is adjusted as the sensitized substrate is scanned by variably inserting an optical filter to attenuate the first optical beam, the second optical beam, or the illumination beam, or any combination thereof.

Example 51 includes the subject matter of any of Examples 48-50, and further specifies that the 1D pattern is line/space pattern having a varying duty cycle.

In view of the many possible embodiments to which the principles of the disclosed technology may be applied, it should be recognized that the illustrated embodiments are only preferred examples and should not be taken as limiting the scope of the disclosure.

We claim:

1. An exposure apparatus which exposes a workpiece with an illumination beam from a grating reticle, the exposure apparatus comprising:
   a workpiece stage operable to translate the workpiece along an axis parallel to grating lines in the grating reticle;
   a projection optical system situated to receive the illumination beam from the grating reticle and operable to form a line pattern in a sensitized layer on a workpiece based on diffraction orders produced by the grating reticle; and
   a control unit configured to select an exposure dose provided by the illumination beam to the sensitized layer operable to produce a selected duty cycle of the line pattern in the sensitized layer.

2. The exposure apparatus of claim 1, wherein the control unit includes a filter situated to selectively attenuate the illumination beam to produce the exposure dose associated with the selected duty cycle.

3. The exposure apparatus of claim 2, wherein the control unit includes an actuator operable to rotate the filter, and the filter is a rotary gradient filter.

4. The exposure apparatus of claim 2, wherein the control unit includes a filter situated to selectively attenuate at least one of the diffraction orders to select the exposure dose associated with the selected duty cycle.

5. The exposure apparatus of claim 4, wherein the control unit is coupled to a light source and is operable to establish illumination beam power received by the projection optical system to produce the exposure dose associated with the selected duty cycle.

6. The exposure apparatus of claim 4, wherein the control unit includes an actuator operable to translate the filter to select the exposure dose, wherein the filter is a linear gradient filter.

7. The exposure apparatus of claim 1, wherein the control unit is coupled to a light source and is operable to establish illumination beam power received by the projection optical system to produce the exposure dose associated with the selected duty cycle.

8. The exposure apparatus of claim 1, wherein the control unit is coupled to the workpiece stage and operable to produce the exposure dose associated with the selected duty cycle based on a scan rate of workpiece stage.

9. The exposure apparatus of claim 1, further comprising a first optical array including a plurality of first optical segments and a second optical array including a plurality of second optical segments, wherein each of the first optical segments is situated to form a corresponding image of illumination radiation from a light source at or near the second optical array, and the second optical array is situated to overlap illumination radiation from the first optical array at the grating reticle to produce the illumination beam.

10. The exposure apparatus of claim 9, wherein the light source is an EUV light source, a UV light source, or a visible light source.

11. The exposure apparatus of claim 9, wherein the first optical array and the second optical array are lens arrays or the first optical array and the second optical array are reflector arrays.

12. The exposure apparatus of claim 1, further comprising a stop situated to select the diffraction orders produced by the grating reticle and delivered to the sensitized layer.

13. The exposure apparatus of claim 1, further comprising an illumination system operable to produce the illumination beam and deliver the illumination beam to the grating reticle, the illumination system including:
a collection reflector situated to receive EUV radiation from a radiation source, the collection reflector having a reflective surface defining a plurality of reflective segments; and
an illumination reflector having a plurality of reflective segments, the illumination reflector situated to receive the EUV radiation from the collection reflector, wherein each element of the illumination reflector is situated to produce an image of a corresponding reflective segment of the collection reflector at the grating reticle.

14. The exposure apparatus of claim 13, wherein each reflective segment of the collection reflector is situated to produce a respective image of a source region defined by the radiation source at the corresponding reflective segment of the illumination reflector.

15. The exposure apparatus of claim 13, wherein the collection reflector is situated with respect to a source region defined by the radiation source so that each of the plurality of reflective segments produces a respective subbeam that is directed toward an axis of the collection reflector.

16. The exposure apparatus of claim 15, wherein the collection reflector defines an aperture situated to transmit the EUV radiation from the radiation source to a radiation source region.

17. The exposure apparatus of claim 15, wherein the reflective surface on which the plurality of reflective segments is defined is a concave surface facing the illumination reflector.

18. The exposure apparatus of claim 17, wherein a curvature of the concave surface is selected so that the subbeams propagate towards the illumination reflector by crossing an axis of the concave surface.

19. The exposure apparatus of claim 18, wherein an aperture is defined in the concave surface and on the axis of the concave surface.

20. The exposure apparatus of claim 13, wherein the collection reflector and the illumination reflector are the only two reflectors of the illumination system.

21. The exposure apparatus of claim 13, wherein the illumination reflector has a planar surface on which each of the reflective segments of the illumination reflector is defined.

22. The exposure apparatus of claim 13, wherein the reflective surface of the collection reflector defines a diffraction grating.

23. The exposure apparatus of claim 22, wherein the diffraction grating has a pitch selected so that radiation at selected wavelengths longer than an EUV wavelength is diffracted away from the grating reticle.

24. The exposure apparatus of claim 1, wherein the grating reticle comprises:
a substrate; and
a diffraction grating defined on the substrate, the diffraction grating having a variable phase along at least one axis.

25. The exposure apparatus of claim 24, wherein the diffraction grating is defined as a plurality of zones having respective phase shifts with respect to adjacent zones.

26. The exposure apparatus of claim 25, wherein the zones of the plurality of zones are separated at respective boundaries that extend perpendicular to the at least one axis.

27. The exposure apparatus of claim 26, wherein grating lines in adjacent zones have a phase difference of 180 degrees.

28. The exposure apparatus of claim 24, wherein grating lines of the diffraction grating are parallel to the at least one axis.

29. The exposure apparatus of claim 24, wherein the substrate is curved about an axis parallel to the at least one axis.

30. The exposure apparatus of claim 29, wherein the substrate is curved and the variable phase of the diffraction grating is selected to provide a first focal length and a second focal length, respectively.

31. A method for printing a 1D pattern, comprising:
illuminating a grating reticle with an illumination beam;
directing a first optical beam and a second optical beam from the grating reticle to interfere at a sensitized substrate, wherein the first optical beam and the second optical beam are associated with respective diffraction orders of the illumination beam; and
adjusting an optical dose provided by at least one of the first optical beam and the second optical beam to produce a selected duty cycle of line/space pairs produced by the interference at the sensitized substrate.

32. The method of claim 31, wherein the optical dose is adjusted by attenuation of at least one of the first optical beam, the second optical beam, and the illumination beam with a filter, adjusting an optical power in the illumination beam, or adjusting a scan rate of the sensitized substrate in the interference of the first optical beam and the second optical beam, or any combination thereof.

33. The method of claim 32, wherein the optical dose is adjusted as the sensitized substrate is scanned by variably inserting an optical filter to attenuate the first optical beam, the second optical beam, or the illumination beam, or any combination thereof.

34. The method of claim 32, wherein the 1D pattern is line/space pattern having a varying duty cycle.

\* \* \* \* \*